(12) United States Patent
Morrow et al.

(10) Patent No.: US 7,339,271 B2
(45) Date of Patent: Mar. 4, 2008

(54) METAL-METAL OXIDE ETCH STOP/BARRIER FOR INTEGRATED CIRCUIT INTERCONNECTS

(75) Inventors: Xiaorong Morrow, Portland, OR (US); Jihperng Leu, Portland, OR (US); Markus Kuhn, Hillsboro, OR (US); Jose A. Maiz, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 233 days.

(21) Appl. No.: 10/861,657

(22) Filed: Jun. 3, 2004

(65) Prior Publication Data

US 2004/0224515 A1    Nov. 11, 2004

Related U.S. Application Data

(62) Division of application No. 10/255,930, filed on Sep. 25, 2002.

(51) Int. Cl.
 *H01L 23/52* (2006.01)
(52) U.S. Cl. ..................... 257/758; 257/774
(58) Field of Classification Search ........ 257/E23.142, 257/E23.141, E23.145, 758, 774
 See application file for complete search history.

(56) References Cited

U.S. PATENT DOCUMENTS

| | | |
|---|---|---|
| 6,093,635 A | 7/2000 | Tran et al. |
| 6,147,000 A | 11/2000 | You et al. |
| 6,153,523 A | 11/2000 | Van Ngo et al. |
| 6,160,315 A * | 12/2000 | Chiang et al. .............. 257/762 |
| 6,165,880 A | 12/2000 | Yaung et al. |
| 6,188,135 B1 | 2/2001 | Chan et al. |
| 6,249,055 B1 | 6/2001 | Dubin |
| 6,261,950 B1 | 7/2001 | Tobben et al. |
| 6,277,745 B1 | 8/2001 | Liu et al. |
| 6,319,819 B1 | 11/2001 | Besser et al. |
| 6,444,568 B1 | 9/2002 | Sundararajan et al. |
| 6,800,554 B2 * | 10/2004 | Marieb et al. .............. 438/687 |
| 6,974,762 B2 * | 12/2005 | Gracias et al. .............. 438/485 |

OTHER PUBLICATIONS

Patent Cooperation Treaty's Written Opinion for International application No. PCT/US03/28925, dated Jan. 5, 2005, 5 pgs.

* cited by examiner

*Primary Examiner*—Kiesha L. Rose
(74) *Attorney, Agent, or Firm*—Blakely, Sokoloff, Taylor & Zafman LLP

(57) ABSTRACT

Described is a method and apparatus for forming interconnects with a metal-metal oxide electromigration barrier and etch-stop. In one embodiment of the invention, the method includes depositing a metal layer on the top of a planarized interconnect layer, the interconnect layer having an interlayer dielectric (ILD) with a top that is planar with the top of an electrically conductive interconnect. In one embodiment of the invention, the method includes reacting the metal layer with the ILD to form a metal oxide layer on the top of the ILD. At the same time, the metal layer will not be significantly oxidized by the electrically conductive interconnect, thus forming a metal barrier on the electrically conductive interconnect to improve electromigration performance. The metal barrier and metal oxide layer together comprise a protective layer. A second ILD may be subsequently formed on the protective layer, and the protective layer may act an etch-stop during a subsequent etch of the second ILD.

19 Claims, 9 Drawing Sheets

METAL-METAL OXIDE ETCH STOP/BARRIER FOR INTEGRATED CIRCUIT INTERCONNECTS

This is a Divisional Application of Ser. No. 10/255,930 filed Sep. 25, 2002, which is presently pending.

FIELD

An embodiment of the invention relates generally to the field of semiconductor technology and, more specifically, to the formation of interconnects in an integrated circuit.

BACKGROUND

Conventionally, the formation of metal interconnects within an integrated circuit requires a distinct deposition of an etch-stop layer on top of an ILD/metal interconnect layer before a subsequent level of interconnect is processed. For example, FIG. 1 illustrates a metal interconnect formed according to a conventional technique. Referring to FIG. 1, an interlayer dielectric (ILD) 102 is deposited on an etch-stop layer 104, typically silicon nitride. A via 106 and trench 107 are patterned into the ILD 102 according to well-known dual damascene techniques. A barrier layer 108 may be formed on the bottom and sidewalls of the via 106 and the trench 107. The via 106 and trench 107 are then filled with an electrically conductive material, such as copper and planarized to the top of the ILD 102, thus forming a copper interconnect 110. An etch-stop layer 112, is deposited over the planarized ILD 102, the planarized barrier layer 108, and the planarized interconnect 110. Consequently, a second ILD 114, second barrier layer 118, and second interconnect 116 may be formed, the second barrier layer 118 and second interconnect 116 connecting to the first interconnect 110 to provide electrical connection between interconnects 110 and 116. The process may repeat itself for additional ILD/interconnect layers.

The typical method, however, suffers from problems. For instance, the deposition of the etch-stop layer 112 must be performed before subsequent ILD layers can be formed and patterned. The deposition of the etch-stop layer, however, is time consuming and costly because specialized equipment must be used to deposit a traditional nitride or oxide material. Furthermore, the etch-stop layer 112 is a dielectric material typically formed very thick, usually between 30 to 150 nanometers, which significantly adds to the dielectric value of the circuit. The dielectric value is closely tied to the RC response of the circuit. Therefore, the etch-stop layer 112 significantly increases the overall RC delay of the circuit.

Additionally, the etch-stop layer 112, typically silicon nitride, does not inhibit interfacial diffusion of metal, such as copper, effectively at the top 120 of the interconnect along the interface between the etch-stop layer 112 and the interconnect material 110. Interfacial diffusion has been identified as the primary cause of premature electromigration failure.

Some attempts have been made to try and cap the top of the metal interconnect, however these approaches require a very selective process wherein a capping metal can only be deposited onto the metal interconnect, but not onto the ILD. In addition, a separate etch-stop deposition is needed for unlanded via design rules.

BRIEF DESCRIPTION OF THE DRAWINGS

The present invention is illustrated by way of example and should not be limited by the figures of the accompanying drawings in which like references indicate similar elements and in which.

DETAILED DESCRIPTION

Described herein is a method and apparatus for forming interconnects with a metal-metal oxide electromigration barrier and etch stop. In the following description numerous specific details are set forth. One of ordinary skill in the art, however, will appreciate that these specific details are not necessary to practice embodiments of the invention. While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art. In other instances well-known semiconductor fabrication processes, techniques, materials, equipment, etc., have not been set forth in particular detail in order to not unnecessarily obscure embodiments of the present invention.

A method of forming interconnect layers is described below that does not require a separate etch-stop deposition or selective deposition of a capping metal. In one embodiment of the invention, a metal layer is deposited with a portion contacting an interlayer dielectric ("ILD") and a portion contacting an electrically conductive interconnect. The portion of the metal layer contacting the ILD reacts with the ILD to form a metal oxide over the ILD. However, the portion of the metal layer contacting the electrically conductive interconnect acts as a metal cap over the electrically conductive interconnect to improve electromigration performance. The metal oxide and metal cap collectively act as an etch-stop layer during the subsequent patterning of an overlying ILD.

Figure 1:
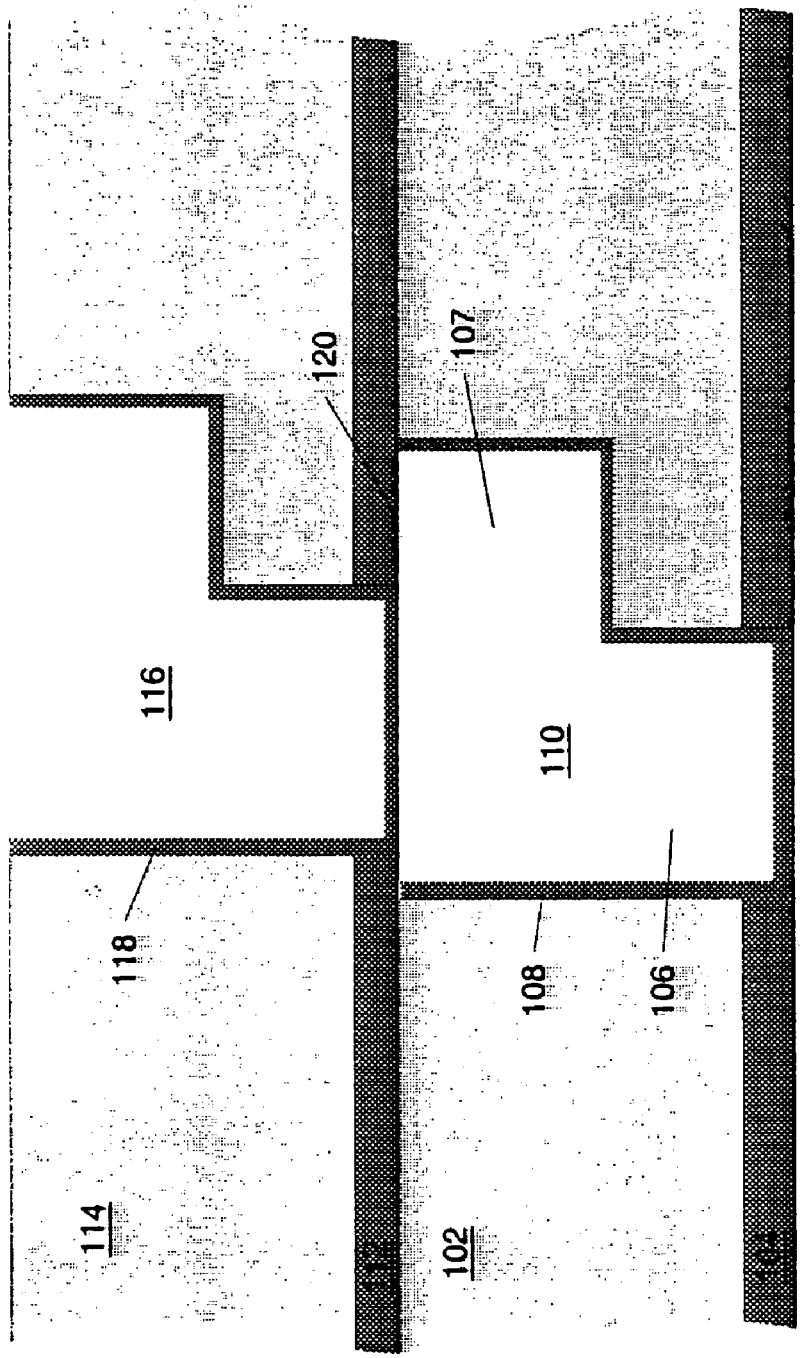
FIG. 1 illustrates a typical method of forming interconnects, according to the prior art.
Figure 2A:
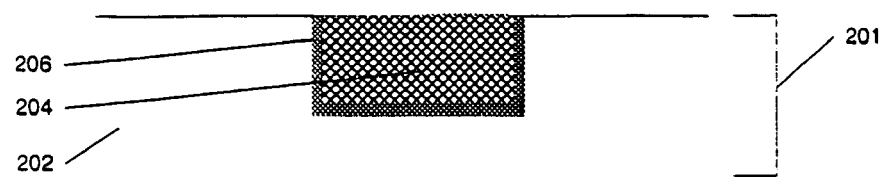
FIGS. 2A-2Q illustrate a method of forming an interconnect, according to one embodiment of the invention.

The method begins with an integrated-circuit structure 201, as shown in FIG. 2A, which includes a substrate 202 supporting a conductor 204 which may be connected to active circuitry and integrated devices within the integrated circuit. The term "substrate" encompasses a semiconductor wafer, such as monocrystalline silicon, as well as structures that have one or more insulative, semi-insulative, conductive, or semiconductive layers and materials. Thus, for example, the term embraces silicon-on-insulator, silicon-on-sapphire, and other advanced structures. The conductor 204 can be a material such as copper, silver, gold, or aluminum, clad in a diffusion barrier 206, such as titanium nitride or tantalum nitride, to prevent the conductor 204 material from diffusing into the substrate 202.

Figure 2B:
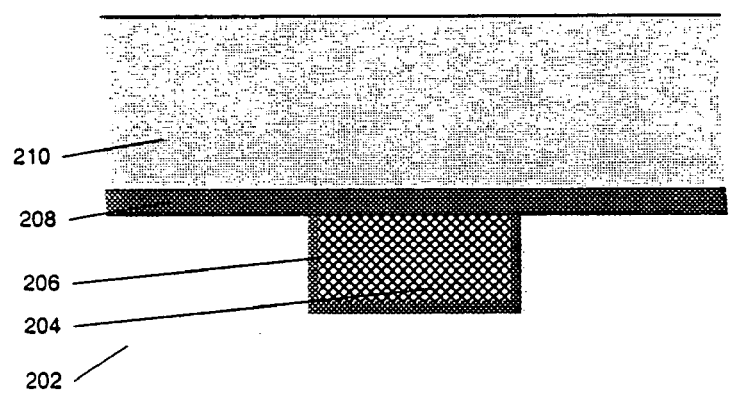

Atop the integrated-circuit structure 201, as shown in FIG. 2B, a non-conductive etch-stop layer 208 is deposited, typically from 30 to 150 nanometers thick, comprising a material such as silicon nitride, silicon oxynitride, or nitrogen-doped silicon carbide. The etch-stop layer 208 comprises a material that will work as an effective etch-stop to a subsequent etchant, but in addition may also act as a passivation layer. Upon, the etch-stop layer 208 is formed an insulative layer 210, sometimes referred to as an interlayer dielectric, or ILD for short. Herein, the insulative layer 208 will therefore be referred to as an ILD. In one embodiment of the invention, the ILD 210 comprises a material having electrically insulative properties but also containing some form of oxygen. Exemplary ILD's containing oxygen include oxide compounds such as silicon dioxide ($SiO_2$), fluorine-doped silicon oxide (SiOF), or carbon doped oxide (CDO). The presence of oxygen inside the ILD 210 is significant to one embodiment of the invention, as described in further detail in conjunction with FIG. 21 below.

The ILD 210 may be deposited by any known method for depositing a film of dielectric material, including physical and chemical vapor deposition techniques. The thickness of the ILD 210 may vary depending on the design of the integrated circuit (e.g., 1000 to 15000 Å).

Figure 2C:
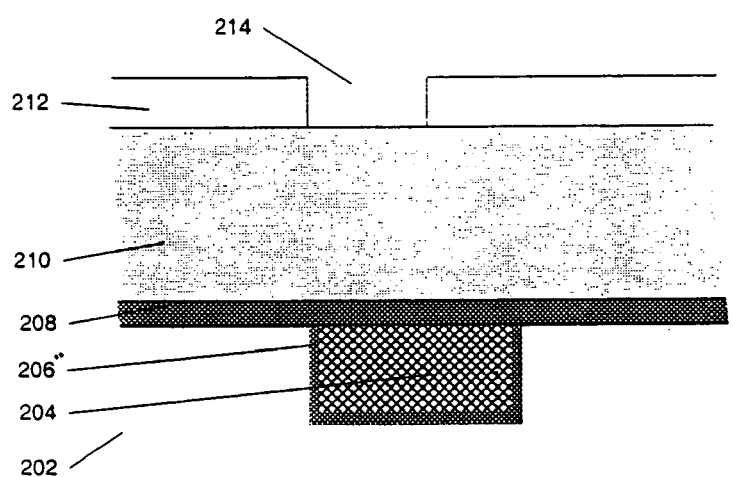
Figure 2D:
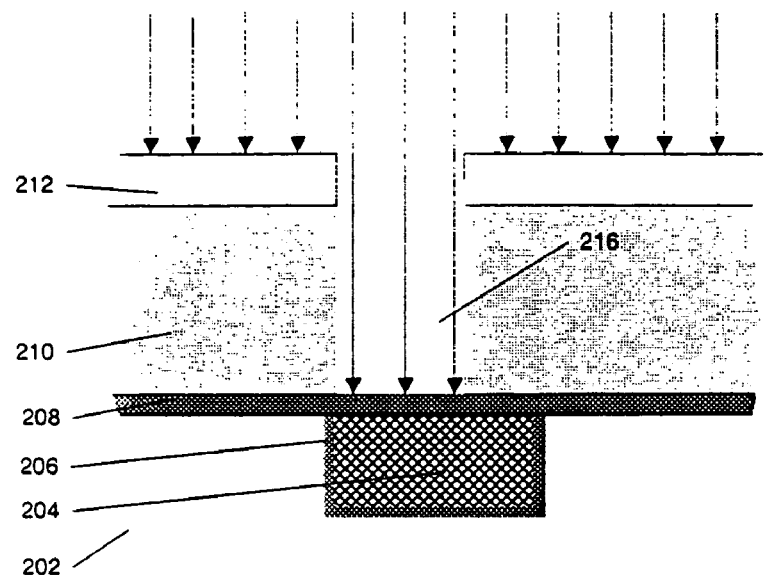

The method may continue, as shown in FIGS. 2C-2D, with patterning the ILD 210 according to conventional dual-damascene techniques, to etch the ILD 210 to form holes, commonly known as vias. Such techniques may include a typical lithography process, as shown in FIG. 2C, including depositing a photoresist layer 212 over the ILD 210 then masking, exposing, and developing the photoresist layer 212 to form a pattern 214 in the photoresist layer 212. Then, as shown in FIG. 2D, the ILD 210 can be etched, according to the pattern 214 in the photoresist layer 212, to first form at least one hole 216, also known as a via, within the ILD 210. The etching may first stop on the etch-stop layer 208. An exemplary method of etching may include reactive ion etching (RIE), or other well-known methods. The photoresist layer 212 can then be removed from atop the ILD 210 and via 217 cleaned.

Figure 2E:
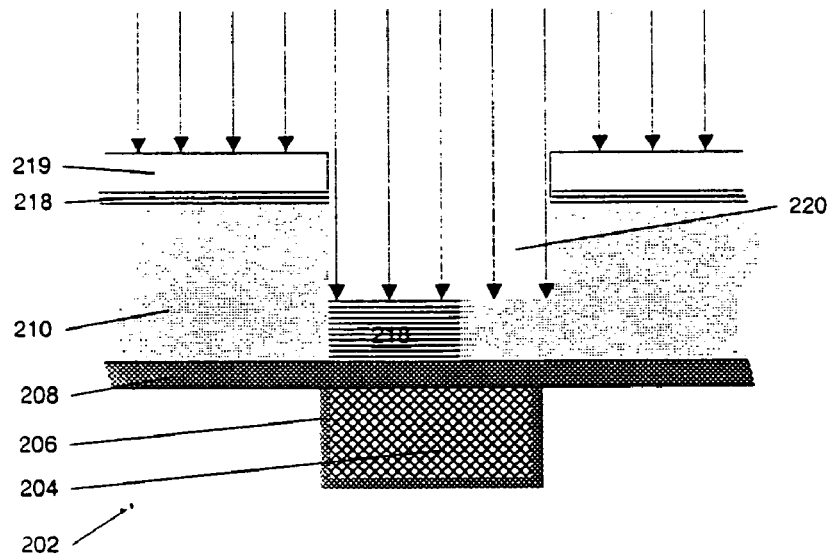

As shown in FIG. 2E, a second patterning process may also be performed, according to conventional dual damascene techniques, to form a trench 220. According to one technique, the second patterning process may include depositing a sacrificial material 218 to fill via 216 completely. The sacrificial material may be a spin-on-polymer (SOP) or spin-on-glass that is deposited by spin coating. The layer may also serve as anti-reflection layer. Another photoresist layer 219 may be deposited on the sacrificial material 218, then the photoresist layer 219 may be masked, exposed, and developed to form another pattern defining a trench formation region. A timed etch, as shown in FIG. 2E, is then performed until trench 220 is formed to a specified depth according to the designed aspect ratio for the trench 220. The photoresist layer 219 may be subsequently removed, as well as the sacrificial material 218, and the etch-stop layer 208 may then be further etched to connect the via 216 with a portion of the underlying conductor 204. A cleaning process may then be performed to remove any residues.

Figure 2F:
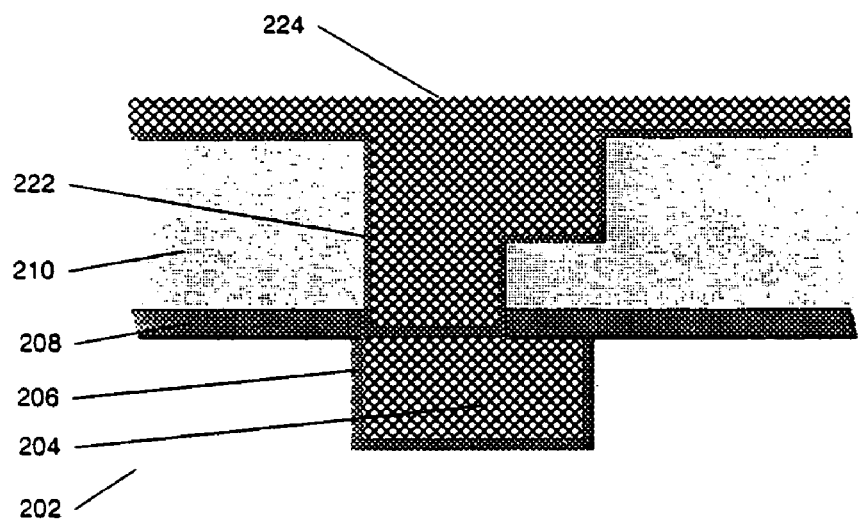

A barrier layer 222 may then be deposited on the top of ILD 210 as well as on the sidewalls and bottom of the via 216 and trench 220. In one embodiment of the invention, a seed layer may be deposited on the barrier layer 222 and on the top of the ILD 210. An electroplating process may then be performed to grow a thin layer of an electrically conductive material out of the seed layer in preparation to fill the via 216 and trench 220. The via 216 and trench 220 may then be filled with an electrically conductive material 224, as shown in FIG. 2F. In one embodiment, the electrically conductive material 224 and the seed layer are copper. The seed layer merges with the electrically conductive material 224. In another embodiment, however, the seed layer may not be present and the electrically conductive material 224 may be deposited directly onto the barrier layer 222. The barrier layer 222 may be necessary to prevent the electrically conductive material 224 from diffusing into the ILD 210, especially if the ILD 210 is not a material that, itself, prevents diffusion, and especially if the electrically conductive material 224 is highly prone to diffusion. Exemplary materials that may be used for the barrier layer 222 include zirconium, titanium, tantalum, tungsten, titanium nitride, tantalum nitride, tungsten nitride, titanium carbide, tantalum carbide, tungsten carbide, hafnium, or other nitrides, carbides, compounds, or materials that will prevent diffusion of the electrically conductive material 224 into the ILD 210. Exemplary materials for the electrically conductive material 224 include copper, gold, silver, and aluminum. The electrically conductive material 224 should be deposited to a thickness that will completely fill the via 216 and the trench 220.

Figure 2G:
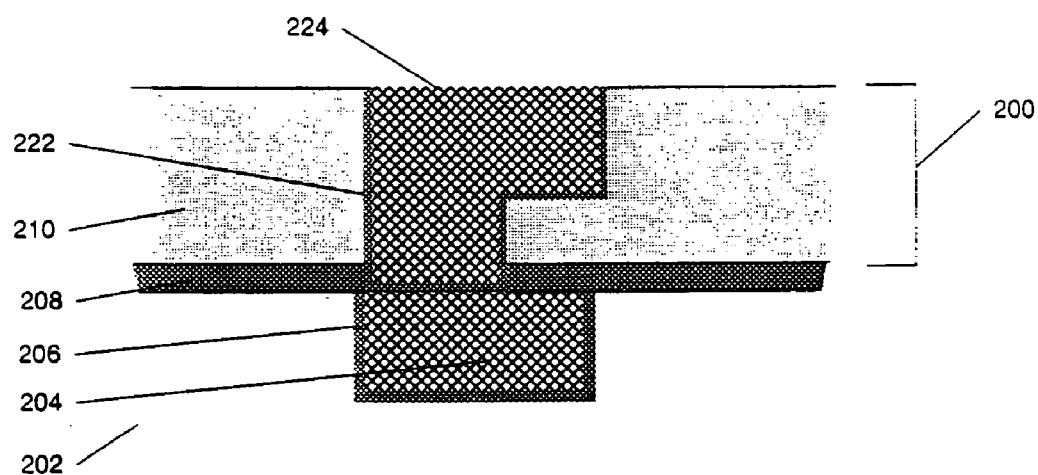

Next, as shown in FIG. 2G, a planarization procedure may be performed, such as a chemical mechanical polish, or CMP for short, to planarize the electrically conductive material 224 and the barrier layer 224 with the top of the ILD 210, thus forming an electrically conductive interconnect 224 within the ILD 210, thus completing the formation of the interconnect layer 200.

Figure 2H:
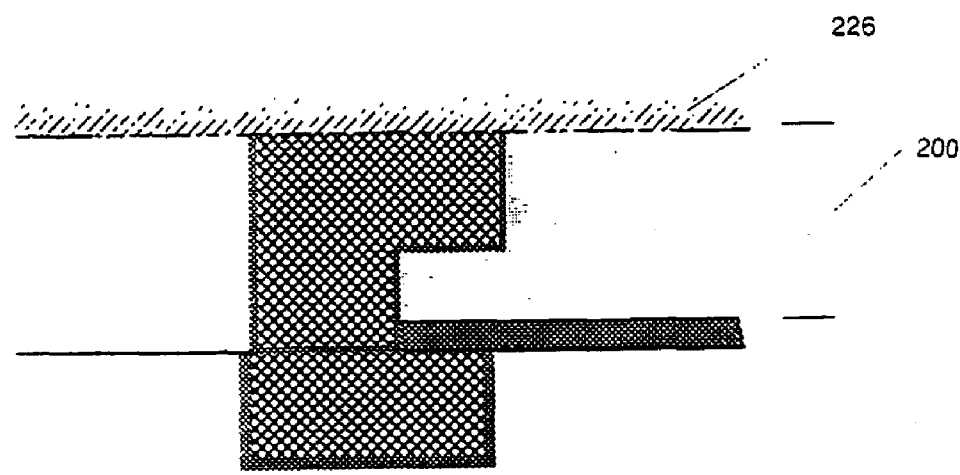

The planarization procedure exposes upper portions of the ILD 210, the interconnect 224, and the barrier layer 222. In a conventional process, if a second interconnect layer were to be subsequently formed upon the first interconnect layer 200, a conventional etch-stop layer deposition would need to be performed, as was previously performed in the formation of the first interconnect layer 200. However, as shown in FIG. 2H, to eliminate the need for a conventional etch-stop layer deposition, such as a silicon nitride layer, a metal material 226 is deposited onto the exposed upper portions of the ILD 210, the interconnect 224, and the barrier layer 222. The deposition of the metal material 226 is cost effective and time saving since the same machinery used to deposit the barrier/seed layers 222 material can be used to deposit the metal material 224. Additionally, the same machinery can be used at subsequent metallization processes while creating other interconnect layers. Furthermore, since a conventional etch-stop layer is a dielectric material typically formed very thick (e.g., 30 to 150 nanometers), a conventional etch-stop layer typically increases the overall RC delay of an integrated circuit significantly. However, since the need for a conventional etch-stop layer is eliminated according to the embodiment of the invention described, the overall RC delay will decrease significantly due to a thinner metal oxide employed in this invention. Therefore, the method described will also provide an integrated circuit having a decreased RC delay, improving performance of the circuit considerably.

The deposition of the metal material 226 may be done by physical vapor deposition methods (e.g., thermal evaporation, sputtering, etc.), chemical vapor deposition methods (e.g., conventional, plasma enhanced, etc.), or by other known methods of depositing a thin metal film. The metal material 226 should be deposited to a thickness sufficient that the resultant layer, described in further detail below, will act as an effective etch-stop to a subsequent ILD etch. However, the metal material 226 should not be deposited so thick that it will interfere significantly with the dielectric value (K value) of the overall circuit. The K value is directly related to the time constant value (RC value) of the circuit, and consequently, if the metal material 226 is deposited too thickly, it may slow down the circuit's performance. Therefore, in one embodiment of the invention, the metal material 226 is deposited to a thickness above approximately 10 Å, with optimal results between approximately 10 Å to 100 Å.

Figure 2I:
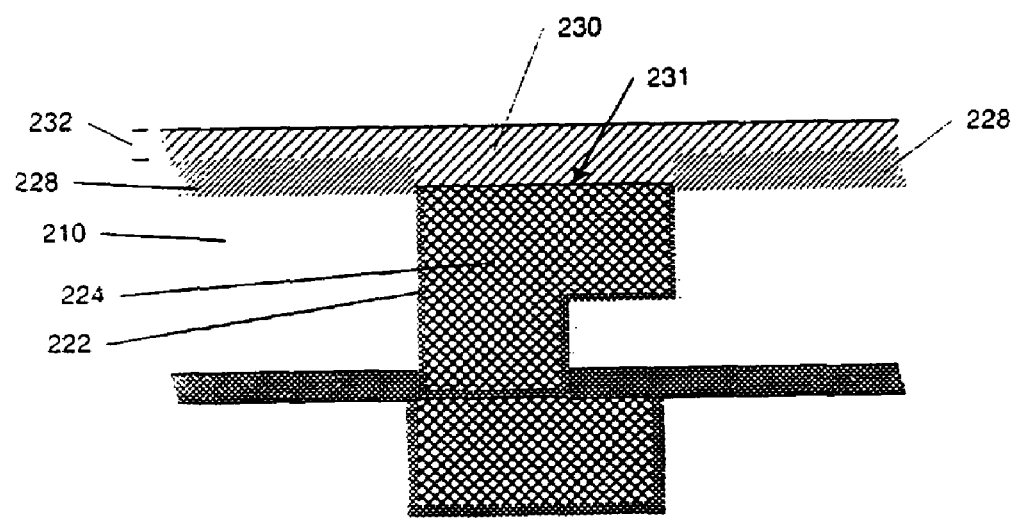

In one embodiment of the invention, the metal material 226 may comprise a material that will automatically react with the exposed upper portion of the ILD 210 as the metal material 226 is being deposited, to form a metal oxide layer 228 over the exposed upper portion of the ILD 210, as shown in FIG. 2I. If the ILD 210 is an oxide material, or in other words if the ILD 210 has a sufficient amount of oxygen contained therein, when the metal material 226 is deposited onto the ILD 210, the metal material 226 and the oxygen in the ILD 210 will automatically react, thus causing the metal material 226 to oxidize, and form the metal oxide layer 228 on contact. As the metal material 226 and the ILD 210 react, a portion of the ILD 210 may be consumed, thus causing the metal oxide layer 228 to protrude slightly into the ILD 210. Exemplary ILD 210 materials that will react with the metal material 226 upon contact may include oxygen compounds ("oxides"), such as silicon dioxide ($SiO_2$), fluorine-doped silicon oxide (SiOF), and carbon doped oxide (CDO). Examples of metal materials that may thus react on contact with the exemplary ILD 210 materials include cobalt, aluminum, tantalum, titanium, and chromium. Consequently, the formed metal oxide layer 228 may comprise tantalum oxide, titanium oxide, aluminum oxide, chromium oxide or cobalt oxide.

Additionally, the metal material 226 may comprise a material that will not significantly be oxidized by the exposed upper portion of the interconnect 224 or the barrier layer 222, thus forming a mostly unreacted metal layer 230, or metal cap 230, over the exposed upper portions of the interconnect 224 and the barrier layer 222, also depicted in FIG. 2I. The metal cap 230 is the same material as the metal material 226. The metal cap 230 and the metal oxide layer 228 are thus formed simultaneously, and both were formed onto the ILD 210, the interconnect 224 and the barrier layer 222 without a need for selective depositions. It should be noted that either at the interface 231 between the metal layer 230 and the copper interconnect 224, or above the metal cap 230, partial oxidation may also occur due to exposure to the ambient, however such oxidation is minimal and effectively inconsequential to electrical communication between the copper interconnect 224 and subsequently formed interconnects. Care should be taken, however, to ensure that as little oxidation occurs as possible at the interface 231 since the oxidation cannot be removed feasibly after the metal cap 230 has been formed.

The metal cap 230 is configured to provide electrical connection between the first interconnect and subsequent interconnects formed above it. The metal cap 230 will inhibit diffusion of the interconnect 224 material along the metal cap/interconnect interface due to better adhesion strength compared to that in a conventional etch-stop/interconnect interface. In other words, the metal cap 230 causes an increase in the activation energy of electromigration along the interface, thus significantly preventing electromigration at the interface, reducing void formation caused by migrating material, thus improving the overall performance of the circuit.

Additionally, the metal cap 230 is advantageous for unlanded via designs wherein a portion of an overlaying ILD is directly above the interconnect. Hence, the metal cap 230 acts as a diffusion barrier that caps the top of the interconnect 224 material from outward diffusion into the surrounding ILD 210 along the edges 231 of the interface between the metal cap 230 and the metal interconnect 224 and also prevents upward diffusion into a subsequently formed overlaying ILD. Additionally, as described in further detail below in conjunction with FIG. 2M, the metal cap 230 and the metal oxide 228 act as an etch-stop layer preventing subsequent etch, ash, and clean processes from damaging the ILD material 210, the metal interconnect 224, or the barrier layer 222.

Furthermore, since the metal cap 230 is configured to provide electrical connection between the first interconnect and subsequent interconnects formed above it, the metal material 226 should not be too electrically resistive a material. If too resistive, the metal cap 230 may not be able to provide good electrical conductivity between the first interconnect 224 and subsequently formed interconnects that may be contacting the metal cap 230. Furthermore, the metal material 226 of the metal cap 230 should not be too prone to diffusion into the interconnect 224 material. If too prone to diffusion into the interconnect 224 material, then in time the metal material 226 would pervade the interconnect 224 producing an undesirable increase in the resistivity of the interconnect 224. An increased resistivity would increase the RC value of the interconnect 224 eventually causing diminished performance of the circuit.

Consequently, the metal cap 230 helps to significantly improve electromigration problems in an integrated circuit, thus improving overall circuit reliability. Plus, because the metal cap 230 was formed at the same time as the oxide layer 228, the method is especially advantageous since the subsequent formation of an additional interconnect layer does not require a etch-stop layer deposition separate from the metal cap 230 deposition.

Figure 2J:
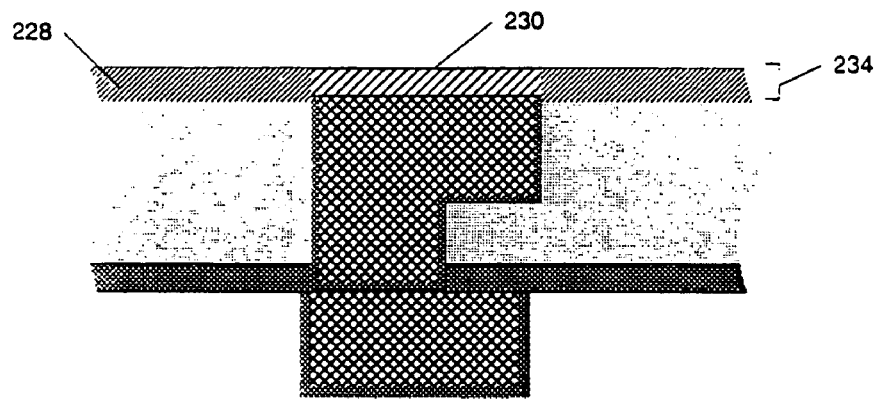

After the metal material 226 has been deposited, and the ILD 210 has reacted with the metal material 226, a portion 232 of metal material 226 above the ILD 210 may not have fully reacted with the ILD 210. This portion 232 is superfluous and undesirable because it would short out the entire circuit if permitted to remain. Therefore, as shown if FIG. 2J, an etch-back may be performed to remove the superfluous portion 232 above the metal oxide layer 228. During such an etch-back process, the etchant should have a chemistry that etches the metal material 226 but does not significantly etch the metal oxide 228, the ILD 210, the interconnect 224, or the barrier layer 222. A standard fluorine based plasma etch may be employed for Ta, while A standard chlorine based plasma etch may be employed for Al and Ti. Furthermore, the etch should not be performed too long or else the metal cap 230 may become etched excessively. Consequently, the etch-back process should be timed to be only as long as necessary to etch the superfluous portion 232 down to the top of the metal oxide layer 228. As shown in FIG. 2J, the metal cap 230 is substantially planar with the metal oxide layer 228, but does not necessarily need to be planar.

The resultant metal oxide layer 228 and metal cap 230 together define a protective layer 234 that can act as an etch-stop to a subsequent ILD patterning and etch. Consequently, as shown in FIGS. 2K-2M, the method may continue with depositing a second ILD 236 on the protective layer 234, then patterning and etching a via 242 in the second ILD 236, with the protective layer 234 acting as an etch-stop during the via etch.

Figure 2K:
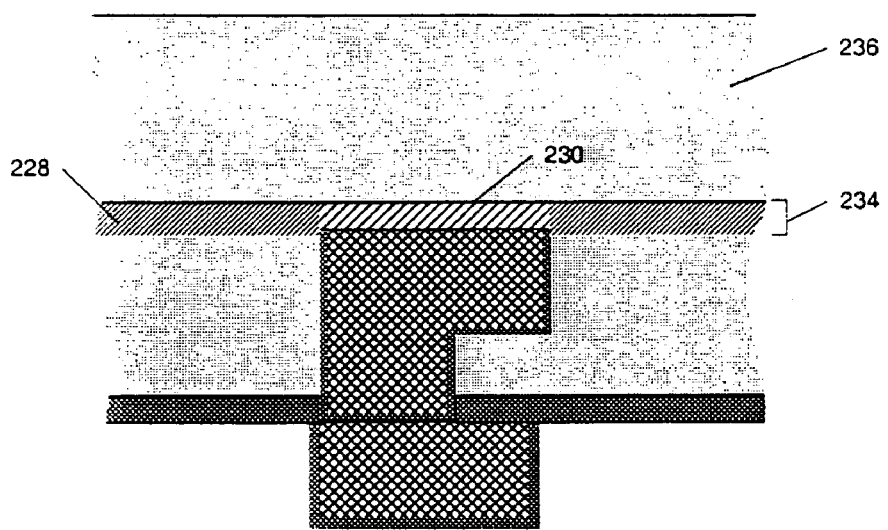

In one embodiment of the invention, as shown in FIG. 2K, the second ILD 236 may be deposited by any known method for depositing a film of dielectric material, including physical and chemical vapor deposition techniques. The second ILD 236 thickness may vary depending on the design of the integrated circuit, but in one embodiment is deposited to a thickness of approximately 6000 Å. The second ILD 236 may comprise the same oxide material as the first ILD 210, such as silicon dioxide ($SiO_2$), fluorine-doped silicon oxide (SiOF), or carbon doped oxide (CDO), or may be a different material from the first ILD 210. If subsequent ILD are to be formed atop the second ILD 236, however, it may be advantageous for the second ILD 236 to be the same material as the first ILD 210.

Figure 2L:
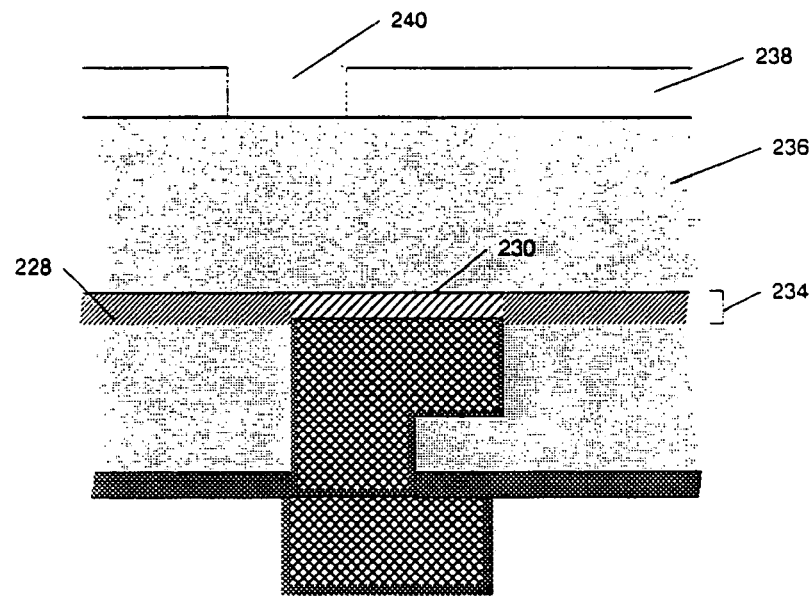

Patterning of the via 242 may include a lithography process, as shown in FIG. 2L, including depositing a photoresist layer 238 over the second ILD 236 then masking, exposing, and developing the photoresist layer 238 to form a pattern 240 in the photoresist layer. Then, as shown in FIG. 2M, the second ILD 236 can be etched, according to the pattern 240 in the photoresist layer 238. An exemplary method of etching may include reactive ion etching (RIE), or other well-known methods. During the etch, if not for the protective layer 234, the underlying ILD 210, interconnect 224 and barrier layer 222 would be attacked and damaged by the etchant 244. Ashing and cleaning may then be performed to remove the photoresist layer 238 and to clean residues from the inside of the via 242. The protective layer 234 also protects the underlying ILD 210, interconnect and barrier layer 222 during the ashing and cleaning processes.

Figure 2M:
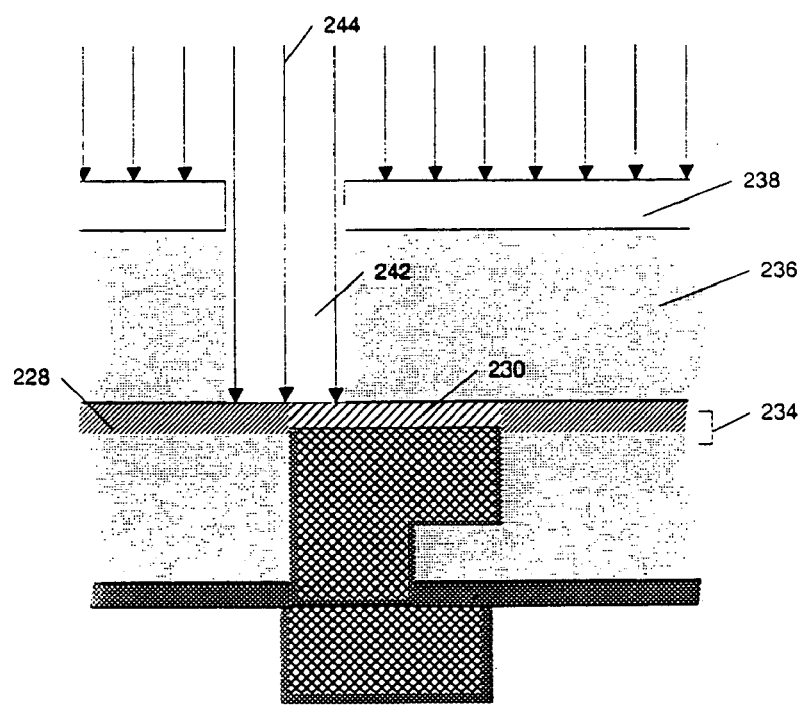

According to one embodiment of the invention, the via 242 may be formed according to an unlanded design, or in other words may be formed so that part of via 242 may overlay the metal oxide layer 228 and another part may overlay the metal cap 230, such as the embodiment depicted in FIG. 2M. Therefore, the etchant 244 used during the etching of the second ILD 236 should include a chemistry that etches the material of the second ILD 236 but does not significantly etch the metal oxide layer 228 or the metal cap 230.

Figure 2N:
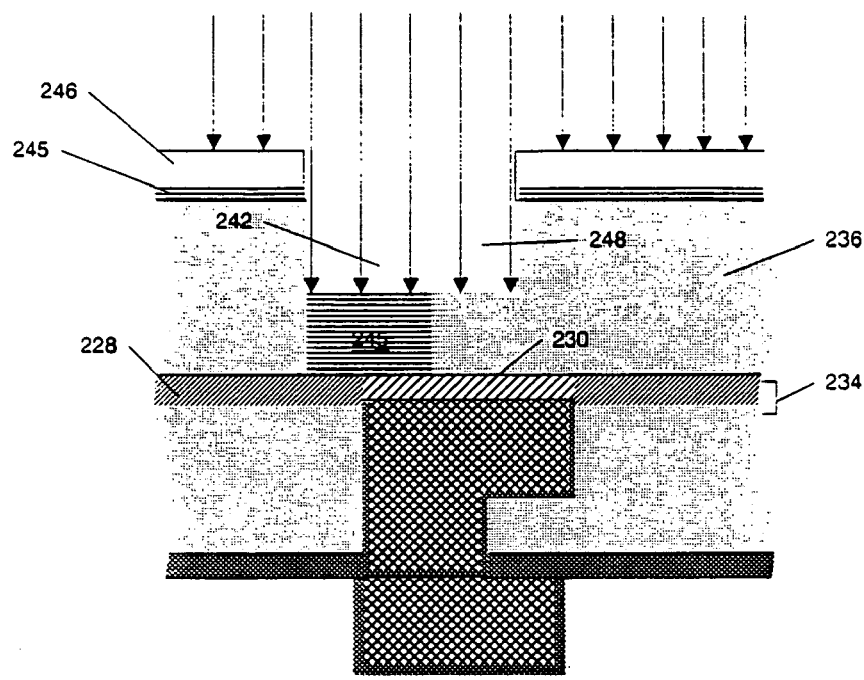

The method may then continue, as shown in FIG. 2N, with performing a second patterning process, according to conventional dual damascene techniques, to form a trench 248. According to one technique, after removing the photoresist layer 238 from atop the second ILD 236, the second patterning process may include depositing a sacrificial material 245, depositing another photoresist layer 246 over the sacrificial material 245, then masking, exposing, and developing the photoresist 246 to form an pattern defining a trench formation region. A timed etch, as shown in FIG. 2N, is then performed until trench 248 is formed to a specified depth according to the designed aspect ratio for the trench 248. The photoresist layer 246 and any remaining sacrificial material 245, may be subsequently removed via ashing and cleaning processes.

Figure 2O:
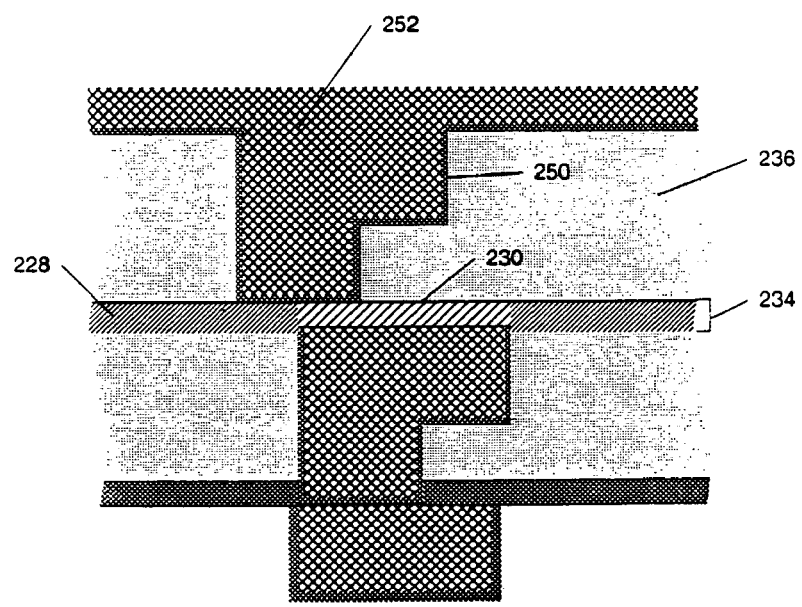
Figure 2P:
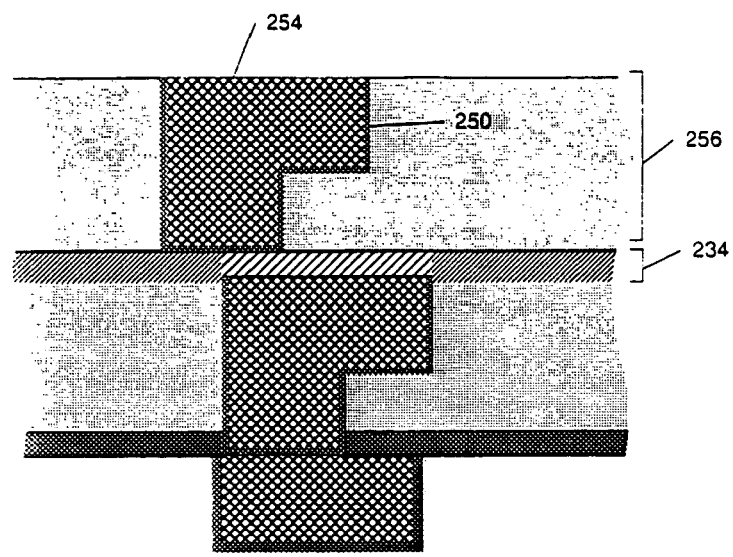
Figure 2Q:
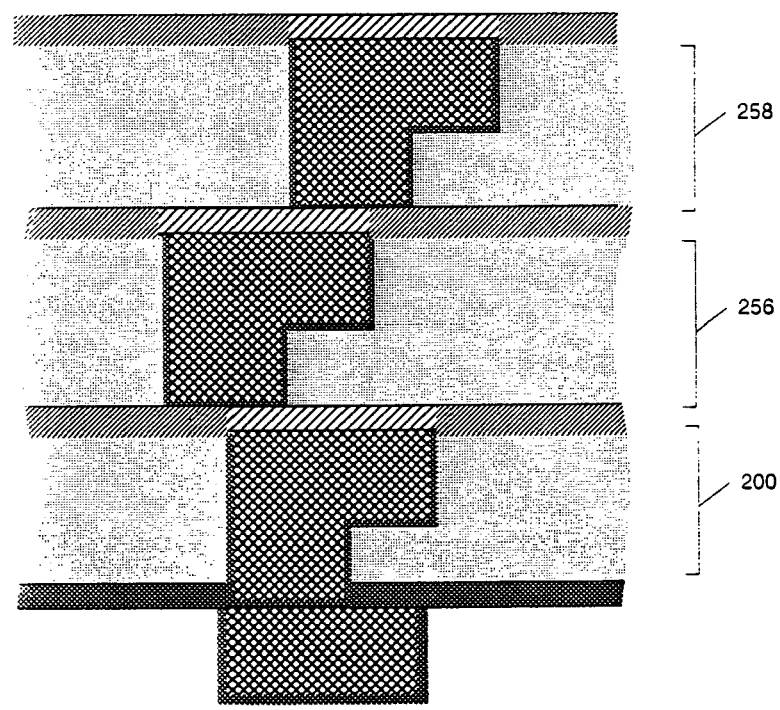

The method may further continue, as shown in FIGS. 2O-2P with forming a second interconnect 254 in the second ILD 236 to form a second interconnect layer 256. As shown in FIG. 2O, a barrier layer 250 may be deposited on top of the second ILD 236 and on the sidewalls of the etched via 242 and trench 248 to prevent lateral diffusion of the subsequently formed interconnect into the second ILD 236. A seed layer may be deposited on the barrier layer 250 and an electroplating process may be performed. An electrically conductive material 252, such as copper, is deposited to a thickness sufficient to completely fill the via 242 and trench 248. Then, as shown in FIG. 2P, a planarization procedure may be performed, such as a CMP, to planarize the electrically conductive material 252 and barrier layer 250 with the top of the second ILD 236, to form a second interconnect 254. Hence, a second interconnect layer 256 is formed above the first interconnect layer 200 utilizing a metal-metal oxide etch-stop layer/electromigration barrier, and thus avoiding a separate, conventional etch-stop layer deposition. The second ILD 236 is protected from interconnect electromigration by the metal cap 230. Then, as shown in FIG. 2Q, the method may repeat for the formation a subsequent interconnect layer 258, and so on.

Several embodiments of the invention have thus been described. However, those skilled in the art will recognize that the invention is not limited to the embodiments described, but can be practiced with modification and alteration within the spirit and scope of the appended claims that follow.

What is claimed:

1. An apparatus, comprising:
a first ILD;
an interconnect within the first ILD, the interconnect having a top surface planarized to a top surface of the first ILD;
a protective layer on the top surface of the interconnect and on the top surface of the first ILD, the protective layer including a metal oxide portion covering the top surface of the first ILD and an electromigration barrier covering the top surface of the interconnect, wherein the metal oxide portion protrudes below a plane defined by the top surface of the interconnect; and
a second ILD on at least the metal oxide portion of the protective layer, wherein the second ILD is in direct contact with the protective layer.

2. The apparatus of claim 1, wherein the protective layer is to act as an etch-stop during etching and cleaning of the second ILD.

3. The apparatus of claim 1, wherein the electromigration barrier comprises a metal and is to improve electromigration of the interconnect.

4. The apparatus of claim 1, wherein the first ILD portion comprises an oxide material.

5. The apparatus of claim 1, wherein the first ILD portion comprises a material selected from the group consisting of $SiO_2$, SiOF, and CDO.

6. The apparatus of claim 1, wherein the electromigration barrier covering the interconnect comprises a material selected from the group consisting of cobalt, aluminum, tantalum, chromium, and titanium.

7. The apparatus of claim 1, wherein the protective layer has a thickness between approximately 10 Å to 100 Å.

8. An apparatus, comprising:
a substrate;
an interconnect layer overlying the substrate, the interconnect layer including an electrically conductive interconnect having a top surface planarized to a top surface of a first ILD;
a protective layer on the interconnect layer, the protective layer including a metal oxide portion covering the first ILD and an electromigration barrier covering the interconnect, wherein the metal oxide portion protrudes below a plane defined by the top surface of the interconnect; and
a second JLD on at least the metal oxide portion of the protective layer.

9. The apparatus of claim 8, wherein the protective layer is to act as an etch-stop.

10. The apparatus of claim 8, wherein the electromigration barrier comprises metal and is to improve electromigration of the interconnect.

11. The apparatus of claim 8, wherein the first RD comprises an oxide material.

12. The apparatus of claim 8, wherein the electromigration barrier covering the interconnect comprises a material that can react, on contact, with an oxide material to form metal oxide.

13. A semiconductor device comprising:
- a first interconnect layer including a first ILD and an electrically conductive interconnect within the first ILD;
- a protective layer on the first interconnect layer, the protective layer including a metal oxide layer covering the first ILD and an electromigration barrier covering the interconnect, wherein a bottom surface of the metal oxide layer protrudes below a plane defined by a top surface of the interconnect; and
- a second interconnect layer including a second ILD and an unlanded via within the second ILD, the unlanded via electrically connected to the interconnect, wherein at least a first portion of the second ILD is in direct contact with the metal oxide layer and at least a second portion of the second ILD is in direct contact with the electromigration barrier.

14. The device of claim 13, wherein the protective layer and the second ILD have different etching properties.

15. The device of claim 13, wherein the protective layer has a thickness between approximately 10 Å to 100 Å.

16. The device of claim 13, wherein the first ILD contains oxygen.

17. The device of claim 13, wherein the electromigration barrier comprises a metal material that can react, on contact, with an oxide material to form metal oxide.

18. The device of claim 17, wherein
- the metal material comprises a material selected from the group consisting of cobalt, aluminum, tantalum, chromium, and titanium; and
- the metal oxide layer comprises one of cobalt oxide, aluminum oxide, tantalum oxide, chromium oxide, or titanium oxide.

19. The device of claim 13, further comprising:
- a substrate beneath the first ILD; and
- a conductor within the substrate electrically connected to the interconnect.

* * * * *